United States Patent [19]

Sandbach et al.

[11] Patent Number: 4,694,776
[45] Date of Patent: Sep. 22, 1987

[54] STEP AND REPEAT APPARATUS

[75] Inventors: Rex H. Sandbach, Stockport; Alan Poole, Macclesfield, both of United Kingdom

[73] Assignee: Co-Ordinate Technology Ltd., Lancaster, England

[21] Appl. No.: 747,662

[22] Filed: Jun. 21, 1985

[30] Foreign Application Priority Data

Jun. 21, 1984 [GB] United Kingdom ................. 8415912
May 20, 1985 [GB] United Kingdom ................. 8512679

[51] Int. Cl.⁴ ............................................. B05C 13/02
[52] U.S. Cl. ..................................... 118/500; 269/56
[58] Field of Search .................... 118/500; 269/56, 58, 269/60; 250/491.1

[56] References Cited

U.S. PATENT DOCUMENTS 3,143,791 8/1964 Lanahan et al. ....................... 269/56
4,485,387 11/1984 Drumheller ..................... 118/697 X Primary Examiner—John P. McIntosh
Attorney, Agent, or Firm—Harry M. Weiss & Associates

[57] ABSTRACT

Step and repeat apparatus used for performance operations upon a generally planar component such as a microprocessor wafer comprises a support for a workpiece, the support being attached by means of an arm to a mechanism adapted to move the support in two dimensions, the arm being pivotally secured to said mechanism at a location remote from the support and lifting means arranged to move the support about the pivot in a plane perpendicular to said two dimensions.

2 Claims, 1 Drawing Figure

U.S. Patent  Sep. 22, 1987  4,694,776
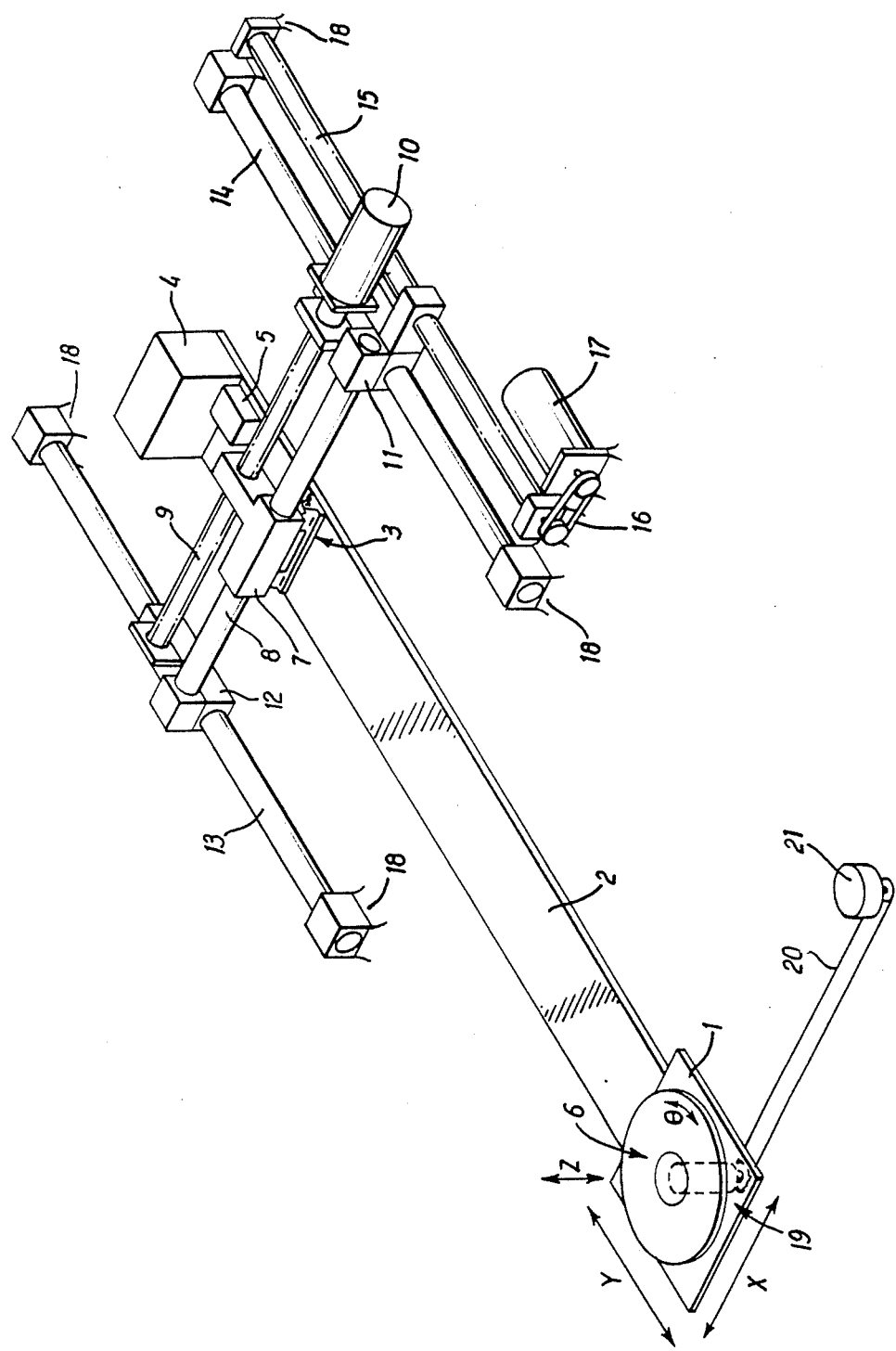

STEP AND REPEAT APPARATUS

BACKGROUND AND SUMMARY

This invention relates to step and repeat apparatus of the kind used for performance of operations upon an approximately planar component. Such a component may be one of a large number each having features located in a not necessarily regular array on the planar surface. The apparatus may be used for performing operations repeatedly on successive components. Examples of step and repeat apparatus include microprocessor wafer probes, printed circuit manufacturing apparatus laser trimmers and other apparatus for manufacture of hybrid circuits.

Wafer probe apparatus is required to move and accurately position a wafer in relation to a probe head. Once in position the wafer is raised into contact with the probe. Conventional apparatus comprises a first bed accurately movable in a first dimension, a second bed mounted upon the first and accurately movable in a second perpendicular dimension and a support located upon the second bed. The support is raised by a lifting mechanism when the wafer is brought into contact with the probe.

The lifting mechanism is relatively sophisticated since it must raise the whole wafer a precise amount for performance of an operation upon the wafer. The position of the wafer is observed by use of a microscope. Difficulties in design arise in arranging for the microscope, beds and lifting mechanism to fit in the distance between a seated user's knees and eyes.

According to the present invention step and repeat apparatus comprises a support for a workpiece and an arm, the support being attached by means of the arm to a mechanism adapted to move the support in two dimensions, the arm being pivotally secured to said mechanism at a location remote from the support, the apparatus further comprising lifting means arranged to move the support about the pivot in a plane perpendicular to said two dimensions.

The lifting means may be remote from the said mechanism. Furthermore the mechanism is preferably not located beneath the microscope, reducing the knee-to-eye distance of the apparatus.

Avoidance of the need for stacking the said mechanism confers great advantage. The lifting mechanism may have a simple, lightweight design. The mechanism does not need to include relatively massive beds which are rigid to support the lifting mechanism. The mechanism may be concealed beneath a dust cover, whereas beds movable with the workpiece are difficult to cover. In addition concealment of the mechanism reduces noise. Furthermore, access to the workpiece is facilitated, for example for wafer handling apparatus, laser marking devices, probes, line width measurement devices etc. Manufacture of the apparatus is much easier with consequent savings in costs.

The invention is further described by means of example and not in any limitative sense.

BRIEF DESCRIPTION OF THE DRAWINGS

The attached drawing is a diagrammatic view of a wafer probe apparatus in accordance with this invention.

DETAILED DESCRIPTION

The apparatus illustrated in the drawing (which is not to scale) comprises a support for a workpiece 1 located at the end of an arm 2 which is pivotally mounted by means of a hinge 3 remote from the support 1 but located in the horizontal plane of the latter when engaging the probe to ensure vertical movement of the wafer as it contacts the probe. The workpiece may be secured to the support by application of a vacuum from a suction device.

A counterbalance 4 is arranged so that the arm 2 and support 1 pivot about their centre of gravity. This allows the arm to have a relatively simple and inexpensive sheet metal construction. The counterbalance of alternative embodiments of the invention may be replaced by a spring in order to reduce the inertia of the apparatus. A motor 5 drives a concealed chain loop (not shown) connected to the chuck or platter 6 of the support 1. The chuck 6 is rotatable about a vertical (z) axis; the motor 5 providing means for adjusting the angular disposition ($\theta$) of a workpiece secured to the chuck.

The hinge 3 is attached to mechanism which enables the arm, and hence the support, to be moved in two perpendicular dimensions (x and y).

A block 7 from which the hinge 3 depends is arranged to slide in the (x) direction upon an accurately machined bar 8. A ball screw 9 driven by a motor 10 engages a ballnut contained in the block 7 to drive the block along the bar 8. End supports 11,12 of the bar 8 are arranged to slide in the (y) direction upon respective accurately machined bars 13,14. The bars 13,14 are aligned perpendicular to the bar 8. A ball screw 15 actuated by a motor 17 and chain drive 16 drives the end support 11.

The (x, y) mechanism is located upon four accurately machined supports 18.

Movement of the chuck 6 about the pivot in the z direction is controlled by a lift mechanism 19 such as a threaded member, driven by a drive belt 20 and motor 21. The chuck 6 is not attached to the lifting mechanism but merely rests upon it.

The advantages of the invention are apparent from consideration of the steps involved in assembly of the apparatus.

In the first step four coplanar location sites 18 are machined on the base plate (not shown). Prior art apparatus comprising x and y beds require entirely machined baseplates to support their weight.

The parallel shafts 13,14 are located in inexpensive recirculating ball bushings attached to the location sites 18. The shafts 13,14 may be simply aligned with a gauge.

The cross bar 8 is mounted on the end support slides 11,12 between the bars 13,14. In prior art devices a cross table is suspended between beds movable on an orthogonal axis.

The arm 2 is mounted upon the bar 8. Perpendicularity of the bar 8 may be easily checked against the accurately perpendicular grid of a wafer mounted on the support 1.

Maintenance of the x,y mechanism does not involve interference with the support 1, in contrast to prior art devices in which the support surmounts the x,y mechanism.

The lightweight construction of the x,y mechanism allows the use of lightweight recirculating ball screws for the drives. Prior art devices employ more expensive ball or lead screws.

The apparatus finds application in wafer probes, laser trimmers and other apparatus for manufacture of hybrid circuits and other electronic components.

In addition to the mechanical arrangement described above, the apparatus also incorporates a microprocessor control system, edge sensors to detect the edges of a wafer under test and markers for applying ink marks to defective chips. The apparatus is coupled in use to a host computer system adapted to test a chip connected to the contacts of the probe.

The control system serves to give a user manual and automatic control of the location of microscope stage and of the height and attitude of the chuck. The control system includes three sub-systems: a main subsystem and two motor control sub-systems. The main sub-system serves to actuate the user-system interface i.e. a keyboard and VDU display. Operation of the motor control sub-systems which actuate the motors is controlled by the main sub-system. The main sub-system also communicates with the host computer, controls the interface with the host computer and controls the edge sensing equipment and chip marker.

The motor control sub-systems are adapted to communicate with the host computer, and to generate signals for actuation of the respective motors. Acceleration and deceleration of motors and protective functions are also controlled by these sub-systems.

The keyboard of the user-system interface may have the following keys;
(i) DISP—this key allows the existence and termination of system; functions;
(ii) HOME—this key returns the stage to the "HOME" or load positions;
(iii) PAUSE—this key permits the operator to "PAUSE" or suspend function operation;
(iv) VAC—this key permits the operator to activate or deactivate the vacuum hold down circuit.
(v) LCL—this key permits the operator to interrupt the host computer in the event that the operation of the machine is impaired or malfunctioning.
(vi) MARK—this key has several functions dependent on a sub-function activated at the time in question.
(vii) CONT—this key permits the operator to "CONTINUE" the function operation after previously being "PAUSED".
(viii) DEL—this key permits the operator to "DELETE" a previously entered data digit.
(ix) ENTER—this key permits the operator to "ENTER" a selected function or sub-function or to terminate data string entry.
(x) "numeric"—these keys enable the operator to enter numeric data in order to select or modify index size, Z lift parameters etc.

The host system communicates with each motor control sub-system along a twenty six way bus. The bus (local bus) comprises the following:
Data Out—4 lines of binary coded decimal data.
Data In—4 lines of binary coded decimal data.
Status In—4 lines of co-processor status.
Status Out—4 lines of main-processor status.
Drive Select Out—8 lines permitting a maximum of 8 co-processors to share the bus at any one time.
Reference Supplies—2 lines tying up to logic 0 v to 5 v supplies.

The data sent and received along the Local Bus consists of two main types of numeric values:

(i) Absolute position data (for both axes)
(ii) "Stop when" position data (for both axes).

The host computer communication system provides a capability of exercising control and the ability to set up or modify wafer parameters remote from the system itself i.e. on-line.

The message interchange via either of the two communication systems available fall into two categories namely:
(i) "Passive" commands—these are commands that result in no change in position of the stage after command execution.

The ATE/tester interface readily permits the user to link the probing system and test system.

A system ancillary port permits the monitoring of the edge sensing system and activation of the three linker drive circuits.

A password protection system prevents accidental or unathorised access to the data contained within the apparatus.

The apparatus incorporates means for detecting the edge of a wafer and for minimising the time spent locating the chips on the wafer.

The traditional approach to this has been the use of a two crossed probe assembly known as an edge sensor, such as a break-on-contact switch. The switch opens as it contacts the wafer. Opening of the contact pair indicates that the probing fixture is positioned above the wafer. If the contact pair remains closed this indicates that the probing fixture has stepped over the edge of the wafer. This action of stepping over the edge of the slice should then cause the stage to drive forward one index size in the Y axis.

Preferred apparatus in accordance with this invention is provided with the ability to determine the location of a complete device for test relative to the location of the preceding device.

In order to ascertain whether the system needs to increase or decrease to the left or right, the length of a row of complete devices to be probed, the system first determines which of four quadrants of the wafer the probing fixture is in.

The four quadrants may be defined as:
A. Upper, left of centre—9 o'clock to 12 o'clock on a clock face
B. Upper, right of centre—12 o'clock to 3 o'clock on a clock face
C. Lower, left of centre—6 o'clock to 9 o'clock on a clock face
D. Lower, right of centre—3 o'clock to 6 o'clock on a clock face.

If the stage is in quadrant A relative to the probing fixture position and if the direction of travel is to the left then there is no further calculation required until quadrant B is reached. If the direction of travel is to the right, then when the edge is predicted for the next index right, the stage must move forward one index and shorten the row from the left.

If the stage is in quadrant B relative to the probing fixture position and if the direction of travel is to the right then there is no further calculation required until quadrant A is reached. If the direction of travel is to the left then when the edge is predicted for the next index left, the stage must move forward one index and shorten the row from the right.

If the stage is in quadrant C relative to the probing fixture position and if the direction of travel is to the left then no further calculation is required until quadrant D is reached. If the direction of travel is to the right then when the edge is predicted for the next index right, the stage must move forward one index and increase the row from the left.

If the stage is in quadrant D to the probing fixture position and if the direction of travel is to the right then there is no further calculation required until quadrant C is reached. If the direction of travel is to the left then when the edge is predicted for the next index left, the stage must move forward on index and increase the row from the right.

The basic method for determining where to go next involves the questions:
(a) is the stage left or right of centre?
(b) which direction is it moving?
(c) from (a) and (b) above—does the length of the row increase or decrease?

In most instances the system will already know the current direction of travel and only (a) and (c) would need to be calculated.

The following are examples of the two algorithms required.

```
co_ord_left:
;
; check left co-ordinates
; if error move to next for right
;
        call calc_next_left     ; "move to next" left
        cmp use_x,0             ; null index?
        jz left_fail_a          ; branch yes
        call set_up_x           ; prepare x
        sub ax,factor_x         ; make destination
        jc left_fail_a          ; branch out of limit
        call which_x            ; which sector
        jc ok_left_a            ; branch positive
        mov dest_x,ax           ; save destination offset
        call prepare_y_pos      ; set up y limits
        call centre_down        ; chuck centre - dest_down
        jc pos_pos_quad         ; branch ++ quadrant
        mov dest_down,ax        ; save down offset
        call centre_up          ; chuck centre - dest up
        jc pos_neg_quad         ; branch +- quadrant
        mov dest_up,ax          ; save it
        call up_squared         ; (dest_up) x (dest_up)
        call rad_up             ; ((radius) x (radius) - (dest_up) x (dest_up))
        jc left_fail_1          ; branch out of radius
        call test_dest_x        ; (test - (dest_x) x (dest_x))
        jc left_fail_1          ; branch out of limit ok_left_a:

call index_left         ; index left ok_left:

mov al,0ffh             ; ok flag left_test_end:

cmp al,0ffh             ; set flags
        ret left_fail_a:

jmp left_fail_2_x pos_neg_quad:

call do_cal_up          ; start calc
        jc left_fail_1          ; branch error
```

```
        call test_dest_x       ; (test - (dest_x) x (dest_x)
        jc left_fail_1          ; branch out of limit
        call down_squared       ; (dest_down) x (dest_down)
        call rad_down           ; ((rad) x (rad) - (dest_down) x (dest_down))
        jc left_fail_2          ; branch error
        call test_dest_x        ; (test - (dest_x) x (dest_x))
        jc left_fail_2          ; branch out of limit
        jmp short ok_left_a     ; loop passed
pos_pos_quad:

call do_cal_down        ; start calc
        jc left_fail_2          ; branch error
        call test_dest_x        ; ( test - (dest_x) x (dest_x))
        jc left_fail_2          ; branch out of limit
        jmp short ok_left_a     ; loop passed left_fail_1:

call calc_next_right    ; correct
        cmp skip_it,0ffh        ; skip this?
        jnz left_fail_skip_1    ; branch no
        call down_fit           ; ok to go down?
        jnz left_fail_1a        ; branch no left_fail_skip_1:

mov al,0                ; flag change direction
        jmp left_test_end       ; exit left_fail_1a:

call calc_next_right    ; calc next right index
        cmp use_x,0             ; null index?
        jz end_of_slice_left    ; branch error
        call centre_next_x      ; chuck centre - next x
        jc end_of_slice_left    ; branch yes
        call down_fit           ; ok to go down?
        jnz left_fail_1a        ; branch no and try again
        call index_right        ; do index
        mov al,0                ; flag change direction
        jmp left_test_end       ; exit end_of_slice_left:

call index_right        ; do it
        pop ax                  ; waste return
        jmp go_load             ; exit auto left_fail_2:

call calc_next_right    ; correct left_fail_2_x:
        cmp skip_it,0ffh        ; skip it?
        jnz left_fail_skip_2    ; branch yes
        call calc_next_down     ; calculate next down
        call index_down         ; do it
```

```
left_fail_2a:

call calc_next_left    ; calculate next left index
        cmp use_x,0            ; null index?
        jz left_fail_3a        ; branch yes
        call set_up_x          ; prepare x
        sub ax,factor_x        ; make destination
        jc left_fail_3         ; branch out of limit
        call centre_dest_x     ; chuck centre - dest x
        call do_fail_lr        ; calc a bit
        jc left_fail_3         ; branch error
        call test_dest_x       ; (test - (dest_x) x (dest_x))
        jc left_fail_3         ; branch out of limit
        jmp short left_fail_2a ; loop for more left_fail_3:

call calc_next_right   ; correct left_fail_3a:

call index_left        ; do it left_fail_skip_2:

mov al,0               ; set change direction
        jmp left_test_end      ; loop back co_ord_right:
;
; check right co-ordinates
; if error move to next for left
;
        call calc_next_right   ; calculate next right
        cmp use_x,0            ; null index?
        jz right_fail_a        ; branch yes
        call set_up_x          ; prepare x
        add ax,factor_x        ; make destination
        call which_x           ; which sector?
        jnc ok_right_a         ; branch negative
        not ax                 ; two's complement
        inc ax
        mov dest_x,ax          ; save it
        call prepare_y_pos     ; set up y limits
        call centre_down       ; chuck centre - dest down
        jc pos_pos_quad_right  ; branch ++ quadrant
        mov dest_down,ax       ; save down offset
        call centre_up         ; chuck centre - dest up
        jc pos_neg_quad_right  ; branch +- quadrant
        mov dest_up,ax         ; save it
        call up_squared        ; (dest_up) x (dest_up)
        call rad_up            ; ((rad) x (rad) - (dest_up) x (dest_up))
        jc right_fail_1        ; branch error
        call test_dest_x       ; (test - (dest_x) x (dest_x))
        jc right_fail_1        ; branch out of limit
```

```
ok_right_a:

call index_right        ; index right ok_right:

mov al,0ffh              ; ok flag right_test_end:

cmp al,0ffh              ; set flags
        ret right_fail_a:

jmp right_fail_2_x pos_neg_quad_right:

call do_cal_up           ; start calculation
        jc right_fail_1          ; branch error
        call test_dest_x         ; (test - (dest_x) x (dest_x)
        jc right_fail_1          ; branch out of limit
        call down_squared        ; (dest_down) x (dest_down)
        call rad_down            ; ((rad) x (rad) - (dest_down) x (dest_down))
        jc right_fail_2          ; branch error
        call test_dest_x         ; (test - (dest_x) x (dest_x))
        jc right_fail_2          ; branch out of limit
        jmp short ok_right_a     ; loop passed pos_pos_quad_right:

call do_cal_down         ; start calc
        jc right_fail_2          ; branch error
        call test_dest_x         ; ( test - (dest_x) x (dest_x))
        jc right_fail_2          ; branch out of limit
        jmp short ok_right_a     ; loop passed right_fail_1:

call calc_next_left      ; correct
        call down_fit            ; ok to go down?
        jnz right_fail_1a        ; branch no
        mov al,0                 ; flag change direction
        jmp right_test_end       ; exit right_fail_1a:

call calc_next_left      ; calculate next left index
        cmp use_x,0              ; null index?
        jz end_of_slice_right    ; branch error
        call centre_next_x       ; chuck centre - next x
        jnc end_of_slice_right   ; branch yes
        call down_fit            ; ok to go down?
        jnz right_fail_1a        ; branch no and try again
        call index_left          ; do it
        mov al,0                 ; flag change direction
        jmp right_test_end       ; exit
```

```
end_of_slice_right:

pop ax                  ; waste return
        jmp go_load             ; exit auto
right_fail_2:
        call calc_next_left     ; correct
right_fail_2_x:
        call calc_next_down     ; calc next index down
        call index_down         ; do it
right_fail_2a:
        call calc_next_right    ; calculate next right
        cmp use_x,0             ; null index?
        jz right_fail_3a        ; branch yes
        call set_up_x           ; prepare x
        add ax,factor_x         ; make destination
        mov dest_x,ax           ; save it
        call dest_x_centre      ; do it
        call do_fail_lr         ; calc a bit
        jc right_fail_3         ; branch error
        call test_dest_x        ; (test - (dest_x) x (dest_x))
        jc right_fail_3         ; branch out of limit
        jmp short right_fail_2a ; loop for more
right_fail_3:
        call calc_next_left     ; correct
right_fail_3a:
        call index_right        ; do it
        mov al,0                ; set change direction
        jmp right_test_end      ; loop back
do_cal_up:
        not ax                  ; two's complement
        inc ax
        mov dest_up,ax          ; save dest. up
        call up_squared         ; (dest_up) x (dest_up)
        jmp rad_up              ; ((radius) x (radius) - (dest_up) x (dest_up))
do_cal_down:
        not ax                  ; one's complement
        inc ax                  ; two's complement
        mov dest_down,ax        ; save it
        call down_squared       ; (dest_down) x (dest_down)
        jmp rad_down            ; ((rad) x (rad) - (dest_down) x (dest_down))
do_fail_lr:

mov dest_x,ax           ; save it
        call prepare_y_pos      ; set up y co-ordinates
        call down_centre        ; dest down - chuck centre
        mov dest_down,ax        ; save it
        call down_squared       ; prepare down limit
        jmp rad_down            ; create new limit public down_fit,up_fit down_fit:

call calc_next_down     ; calculate next down index
        cmp use_y,0             ; null index?
        jz down_fail_a          ; branch yes
```

```
        call set_up_y              ; prepare y
        sub ax,factor_y            ; make destination
        jc down_fail_a             ; branch out of limit
        call which_y               ; which sector?
        jc ok_down_a               ; branch positive
        mov dest_y,ax              ; save it
        call prepare_x_pos         ; set up x limits
        call centre_left           ; chuck centre - dest left
        jc pos_pos_quad_down       ; branch ++ quadrant
        mov dest_left,ax           ; save left offset
        call centre_right          ; chuck centre - dest right
        jc pos_neg_quad_down       ; branch +- quadrant
        call left_squared          ; (dest_left) x (dest_left)
        call rad_left              ; ((rad) x (rad) - (dest_left) x (dest_left))
        jc down_fail               ; branch error
        call test_dest_y           ; (test - (dest_y) x (dest_y))
        jc down_fail               ; branch out of limit
ok_down_a:
        call index_down            ; do it
ok_down:
        mov al,0ffh                ; ok flag
down_test_end:
        cmp al,0ffh                ; set flags
        ret
down_fail_a:

jmp down_fail_y
pos_pos_quad_down:

call right_centre          ; dest right - chuck centre
        mov dest_right,ax          ; save offset
        call right_squared         ; (dest_right) x (dest_right)
        call rad_right             ; ((rad) x (rad) - (dest_right) x (dest_right))
        jc down_fail               ; branch error
        call test_dest_y           ; ( limit - (dest_y) x (dest_y))
        jc down_fail               ; branch out of limit
        jmp short ok_down_a        ; else pass ok.

pos_neg_quad_down:

not ax                     ; two's complement
        inc ax
        mov dest_right,ax          ; save dest. right
        call right_squared         ; (dest_right) x (dest_right)
        call rad_right             ; ((rad) x (rad) - (dest_right) x (dest_right))
        jc down_fail               ; branch error
        call test_dest_y           ; (test - (dest_y) x (dest_y)
        jc down_fail               ; branch out of limit
        call left_squared          ; (dest_left) x (dest_left)
        call rad_left              ; ((rad) x (rad) - (dest_left) x (dest_left))
        jc down_fail               ; branch error
        call test_dest_y           ; (test - (dest_y) x (dest_y))
        jc down_fail               ; branch out of limit
        jmp short ok_down_a        ; loop passed
```

These algorithms determine whether a single point on the wafer is located under the probing fixture. As the "die" or device to be tested is always two dimensional, the software needs to perform a "die" sized "fit" into the theoretical wafer area.

The edges of wafers are usually slightly non-circular for two reasons.

(i) A "flat" is used for orientation and tooling purposes.
(ii) Chamfering of the edge of the wafer.

Apparatus in accordance with this invention may overcome any difficulties caused by non-circular wafers by making the assumption that any "flat" on the wafer will adhere to sizes set down by industrial standards and that the chamfer can preclude the need to test part complete devices on the periphery of the wafer.

This problem is overcome by calculating whether it is possible to fit one and a half devices into the space remaining on the wafer, in an analogous manner to the previously listed algorithms. Use of this method eliminates the need for multiple edge sensors and avoids the missing of complete chips which may occur in prior art apparatus if the wafer has an awkward aspect ratio.

The tips of a probe card are generally arranged to lie in a common plane. Three main reasons have been found for failure of probe cards:

(i) Lack of planarity between wafer surface and probing fixture caused solely by mechanical misalignment of the workpiece holder relative to the chuck surface.

(ii) The probing system attempting to "probe" incomplete devices resulting in unequal stress across the probe. In most cases this has been caused by excess travel in use of the normal edge sensing technique.

(iii) When using a simple "dead" lift operation of the chuck. That is to say a chuck lifting mechanism which is solenoid operated. This gives rise to excessive instantaneous force being applied to both wafer and probing fixture. Also the resultant "switch bounce" of the probe tips gives unpredictable contact characteristics which dramatically effect the results obtained in parametric testing.

The present apparatus may overcome these problems as follows.

The provision of the edge sensing capability described above eliminates the risk of probing incomplete devices. By confining the use of the edge sensing circuit purely as a height detector (to establish the moment of wafer touchdown as opposed to wafer presence), the chuck will only lift the amount required and will not "bounce" the probing fixture.

Mechanical accuracy of the chuck lifting mechanism is achieved by the unique "platter-lift" pusher assembly. It now follows that the incremental lift of the chuck needs to be of such a small magnitude as to correct for any small taper in the wafer caused by the sawing or slicing process.

The chuck lift on the system described above may have a single step up or down resolution of approximately 0.00025 of an imperial inch ($6.3 \times 10^{-4}$ cm). By using such a fine resolution in chuck lift, reliable and accurate probing force can be maintained.

The apparatus may be provided with the ability to store the last height location at which the wafer was detected. By operating a search window of $+0.0005''$ and $-0.0005''$ ($\pm 1.27 \times 10^{-}$ cm) to allow for taper of the wafer, the possibility of damage to the probing fixture caused by a malfunctioning edge sensor can be precluded.

Failed devices are marked with a dot of ink which may be up to $0.030''$ ($7.6 \times 10^{-2}$ cm) in diameter. A further problem is caused by dragging the probing fixture tips through the ink dot, which may be $0.008''$–$0.009''$ ($2.0 \times 10^{-2}$–$2.3 \times 10^{-2}$ cm) in height above the wafer surface causing the probe tips to be coated with marking ink. This may cause partial or total electrical isolation between the testing system and the device under test.

In order to overcome this problem the system is provided with the ability to remember during its next index to an adjacent device whether or not the device has been marked (inked). If the current device has been inked the chuck is caused to lower by a pre-programmed amount in order to clear the offending "mountain" of ink. If the device has passed the testing stage, the chuck will only lower the required amount to ensure that the probe tips are clear of the wafer surface.

Another situation that can cause premature termination of the useful life of a probing fixture is fouling of the edge sensor.

To overcome this problem, physical points in the chuck lift cycle are established at which the edge sensor should have been expected to have opened and closed. Failure for the edge sensor to perform in the expected manner causes the chuck system to cease movement and the operator is advised of the problem. This prevents any further damage to the probing fixture and, of course to the wafer under test.

The step and repeat apparatus system software has an internal non-user accessed local bus.

The local bus is physically configured as previously described. The local bus supports one controller interface and two motor control co-processors.

The local bus interface has the facility to read and write information to and from the selected co-processor at any mutually convenient time. This time is ascertained by the main processor polling the ready/busy status line.

The main processor has the capability of initialising the current position of one or all the available co-processors, or the bus, with a value of 0–16,500 inclusive.

The main processor has the capability also of being able to interrogate (read) the position of the stage at any point of travel.

The main processor can command the coprocessor to go to a location on their respective axes simply by sending the desired location (0–16,500) as a destruction command.

The main processor has the facility of sending single four bit commands to the co-processor with the interpretations as listed below.

0000: Traverse main fast clockwise
0001: Traverse main medium clockwise
0010: Traverse main slow clockwise
0011: Single step main clockwise
0100: Traverse aux. until aborted clockwise
0101: Single step aux. clockwise
0110: Next data is absolute position
0111: Next data is absolute destination
1000: Traverse main fast anti-clockwise
1001: Traverse main medium anti-clockwise 1010: Traverse main slow anti-clockwise
1011: Single step main anti-clockwise
1100: Traverse aux. till aborted anti-clockwise
1101: Single step aux. anti-clockwise
1110: Drive to limit 'n' main axis
1111: Drive to limit 'n' aux. axis The above description is included to illustrate the operation of the preferred embodiment and is not intended to limit the scope of the invention. The scope of the invention is to be limited only by the following claims. From the above description, many variations will be apparent to one skilled in the art that would yet be encompassed by the spirit and scope of the present invention.

What is claimed is:

1. Step and repeat apparatus comprising a support for a workpiece and an arm, said support being attached by means of said arm to a movement control mechanism adapted to move said support in two dimensions, said arm having a pivot end and a movement end opposite said pivot end, said pivot end of said arm being secured to allow said arm to rotate about a horizontal pivotal axis at said pivot end, with said movement end of said arm secured to said movement control mechanism at a location remote from said support, said apparatus further comprising lifting means arranged to move the support about the pivot in a plane perpendicular to said two dimensions, said lifting means positioned substantially at said movement end of said arm.

2. Apparatus as claimed in claim 1 the workpiece comprising a carrier for carrying a succession of devices.

* * * * *